(12) United States Patent
Emoto

(10) Patent No.: US 7,705,969 B2
(45) Date of Patent: Apr. 27, 2010

(54) EXPOSURE APPARATUS

(75) Inventor: Keiji Emoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 388 days.

(21) Appl. No.: 11/685,449

(22) Filed: Mar. 13, 2007

(65) Prior Publication Data

US 2007/0229787 A1 Oct. 4, 2007

(30) Foreign Application Priority Data

Mar. 29, 2006 (JP) .............................. 2006-092338

(51) Int. Cl.
G03B 27/42 (2006.01)
(52) U.S. Cl. .............................. 355/72; 355/30; 355/53
(58) Field of Classification Search .................... 355/30, 355/53, 72
See application file for complete search history.

(56) References Cited

U.S. PATENT DOCUMENTS

| 6,642,996 | B2 | 11/2003 | Nogawa | |
|---|---|---|---|---|
| 6,952,253 | B2 | 10/2005 | Lof et al. | |
| 7,075,616 | B2 | 7/2006 | Derksen et al. | |
| 7,081,943 | B2 | 7/2006 | Lof et al. | |
| 7,110,081 | B2 | 9/2006 | Hoogendam et al. | |
| 2004/0136494 | A1 | 7/2004 | Lof et al. | |
| 2004/0160582 | A1 | 8/2004 | Lof et al. | |
| 2005/0007569 | A1 | 1/2005 | Streefkerk et al. | |
| 2005/0078287 | A1 | 4/2005 | Sengers et al. | |
| 2005/0122505 | A1* | 6/2005 | Miyajima | 355/72 |
| 2005/0219488 | A1* | 10/2005 | Nei et al. | 355/53 |
| 2005/0219499 | A1* | 10/2005 | Maria Zaal et al. | 355/72 |
| 2005/0264778 | A1 | 12/2005 | Lof et al. | |
| 2006/0023189 | A1 | 2/2006 | Lof et al. | |
| 2006/0176458 | A1 | 8/2006 | Maria Derksen et al. | |

2006/0232756 A1 10/2006 Lof et al.

(Continued)

FOREIGN PATENT DOCUMENTS

JP 2002-158154 5/2002

(Continued)

OTHER PUBLICATIONS

Korean Office Action dated Apr. 10, 2008, issued in corresponding Korean patent application No. 10-2007-0026552.

*Primary Examiner*—Hung Henry Nguyen
*Assistant Examiner*—Colin Kreutzer
(74) *Attorney, Agent, or Firm*—Fitzpatrick, Cella, Harper & Scinto

(57) ABSTRACT

An exposure apparatus exposes a pattern of an original onto a substrate while a liquid fills a gap between a projection optical system and the substrate. A liquid holding plate sets the substrate, held on a substrate stage, and a peripheral area around a peripheral portion of the substrate, to form substantially the same surface to hold the liquid on the peripheral portion of the substrate. The liquid holding plate includes (i) an inner member formed in the peripheral area around the peripheral portion of the substrate and holds the liquid on the peripheral portion, (ii) an outer member formed on a peripheral portion of the inner member and attaching to the substrate stage, and (iii) a connection member that connects the inner member to the outer member. The connection member has a lower rigidity than those of the inner member and the outer member.

10 Claims, 10 Drawing Sheets

U.S. PATENT DOCUMENTS

| | | |
|---|---|---|
| 2006/0238730 A1 | 10/2006 | Nei et al. |
| 2006/0268250 A1 | 11/2006 | Maria Derksen et al. |
| 2007/0040133 A1 | 2/2007 | Lof et al. |
| 2007/0096764 A1* | 5/2007 | Kono et al. .................. 324/765 |
| 2007/0115450 A1* | 5/2007 | Nagasaka et al. ............. 355/72 |
| 2007/0188731 A1* | 8/2007 | Bezama et al. ................ 355/72 |
| 2008/0198346 A1* | 8/2008 | Iimura et al. .................. 355/30 |

FOREIGN PATENT DOCUMENTS

| | | |
|---|---|---|
| JP | 2004-289127 | 10/2004 |
| JP | 2005-072132 | 3/2005 |
| JP | 2005-101488 | 4/2005 |
| JP | 2005-302880 | 10/2005 |
| WO | WO 2005054953 A2 * | 6/2005 |
| WO | WO 2005055296 A1 * | 6/2005 |

* cited by examiner

EXPOSURE APPARATUS

This application claims the benefit of Japanese Patent Application No. 2006-092338, filed Mar. 29, 2006, which is hereby incorporated by reference herein in its entirety.

BACKGROUND OF THE INVENTION

1. Field of the Invention

The present invention relates to an exposure apparatus, which is used in a lithography process to manufacture devices.

2. Description of the Related Art

A projection exposure apparatus has been conventionally used as an apparatus that projects a circuit pattern image drawn on a reticle, serving as an original, onto a wafer, a glass plate, or the like, serving as a photosensitive substrate, by a projection optical system, and exposes the photosensitive substrate.

In recent years, an immersion exposure apparatus has attracted attention, in which a liquid is present between a projection optical system and a photosensitive substrate, and the refractive index of a medium between the final surface of the projection optical system and the photosensitive substrate is increased to achieve a high resolution. In this immersion exposure apparatus, the liquid fills the gap between the projection optical system and the photosensitive substrate (to be merely referred to as a "substrate" as well hereafter), to increase the numerical aperture (NA) of the projection optical system. The numerical aperture (NA) of the projection optical system can be obtained from $NA = n \cdot \sin \theta$ where n is the refractive index of the liquid (medium). Thus, the NA can increase to n by filling the gap with a medium having a refractive index higher than that of air (n>1). From this relationship, a resolution R ($R = k1(\lambda/NA)$) of the immersion exposure apparatus, which is represented by a process constant k1 and a wavelength $\lambda$ of the light source, can be decreased.

For example, a so-called local fill scheme immersion exposure apparatus has been proposed in which a liquid locally fills the gap between the final surface of a projection optical system and the surface of a wafer. The local fill scheme immersion exposure apparatus requires a specific mechanism, when exposing the peripheral portion of the wafer, to hold the liquid locally between the final surface of the projection optical system and the surface of the wafer. Japanese Patent Laid-Open Nos. 2004-289127, 2002-158154, 2005-101488, and 2005-72132 propose an immersion exposure apparatus, which has a liquid holding plate (auxiliary member), adjacent to the peripheral portion of a wafer and having almost the same height as that of the surface of the wafer, on the stage top plate.

Japanese Patent Laid-Open No. 2005-101488 discloses an arrangement in which a recovery hold member or a porous member is arranged on a wafer stage, and connects to a line which is pressure-reduced by a vacuum pump, or the like, to recover an immersion liquid, entering a groove in the peripheral portion of the substrate, by suction.

With the liquid holding plate having almost the same height as that of the wafer on the stage top plate, when scanning the wafer, part of a liquid membrane (LW) locally held between the final surface of the projection optical system and the wafer surface remains thin on the surface of the liquid holding plate. When the thin liquid membrane remaining on the surface of the liquid holding plate vaporizes, it decreases the temperature of the liquid holding plate. The temperature decrease thermally deforms (shrinks) the liquid holding plate to deform a top plate that supports the liquid holding plate. When the top plate deforms, the relative positional relationship between the measurement mirror of a laser interferometer arranged in the vicinity of the top plate and the wafer changes, to degrade the measurement accuracy of the position and the posture of the wafer.

To recover the remaining immersion liquid, if the wafer stage is provided with a recovery hole member or a porous member to recover the immersion liquid by negative pressure suction, suction decreases the atmospheric pressure near the immersion liquid to promote vaporization of a significant amount of the immersion liquid. In other words, when the quantity to vaporize changes depending on the relative relationship between the pressure around the immersion liquid and the vapor pressure of the immersion liquid, and the pressure around the immersion liquid changes in a decreasing direction, usually, the vaporization quantity increases. Accordingly, the portion around the flow channel, including the recovery hole member or porous members as the suction portion and the vacuum pump, tends to be cooled due to the influence of the vaporization heat. It is known that (pure) water typically used as an immersion liquid, particularly, has a very large heat quantity of vaporization (latent heat) per unit mass, and that vaporization of 1 g of water deprives the flow channel of as large as about 2,400 J of heat. The heat vaporization generated by the immersion liquid deprives a member surface of a vary large heat quantity, directly and locally. Hence, it is difficult to perform highly accurate temperature adjustment, including temperature distribution adjustment, of the entire liquid holding plate. Therefore, in practice, even with temperature adjusting, thermal deformation occurs to a certain degree, due to a change in temperature of the wafer liquid holding plate, to degrade the exposure accuracy.

The present invention has been made in view of the above problems, and has as its object to provide an exposure technique which suppresses an influence of the thermal deformation of the liquid holding plate caused by vaporization heat of an immersion liquid, and realizes excellent exposure accuracy.

SUMMARY OF THE INVENTION

According to one aspect of the present invention, an exposure apparatus exposes a pattern of an original into a substrate, while a liquid fills a gap between a projection optical system and the substrate, the apparatus comprising:

a liquid holding plate which sets the substrate held on a substrate stage and a peripheral area around a peripheral portion of the substrate to form substantially the same surface to hold the liquid on the peripheral portion of the substrate, wherein the liquid plate includes:

(i) an inner member formed in the peripheral area around the peripheral portion of the substrate and holds the liquid on the peripheral portion of the substrate, (ii) an outer member formed on a peripheral portion of the inner member and attaching to the substrate stage, and (iii) a connection member which connects the inner member to the outer member.

According to another aspect of the present invention, an exposure apparatus exposes a pattern of an original onto a substrate, while a liquid fills a gap between a projection optical system and the substrate, the apparatus comprising:

a liquid holding plate which sets the substrate held on a substrate stage and a peripheral area around a peripheral portion of the substrate to form substantially the same surface, to hold the liquid on the peripheral portion of the substrate, and an attaching member to attach the liquid holding plate onto the substrate stage, wherein the attaching member absorbs deformation occurring in the liquid holding plate by elastic deformation, to decrease deformation which is to act on the substrate stage.

The present invention can provide an exposure apparatus, which suppresses an influence of the thermal deformation of a liquid holding plate caused by vaporization heat of a liquid holding plate caused by vaporization heat of a liquid, and realizes excellent exposure accuracy.

Further features of the present invention will become apparent from the following description of exemplary embodiments (with reference to the attached drawings).

DESCRIPTION OF THE EMBODIMENTS

Figure 1:
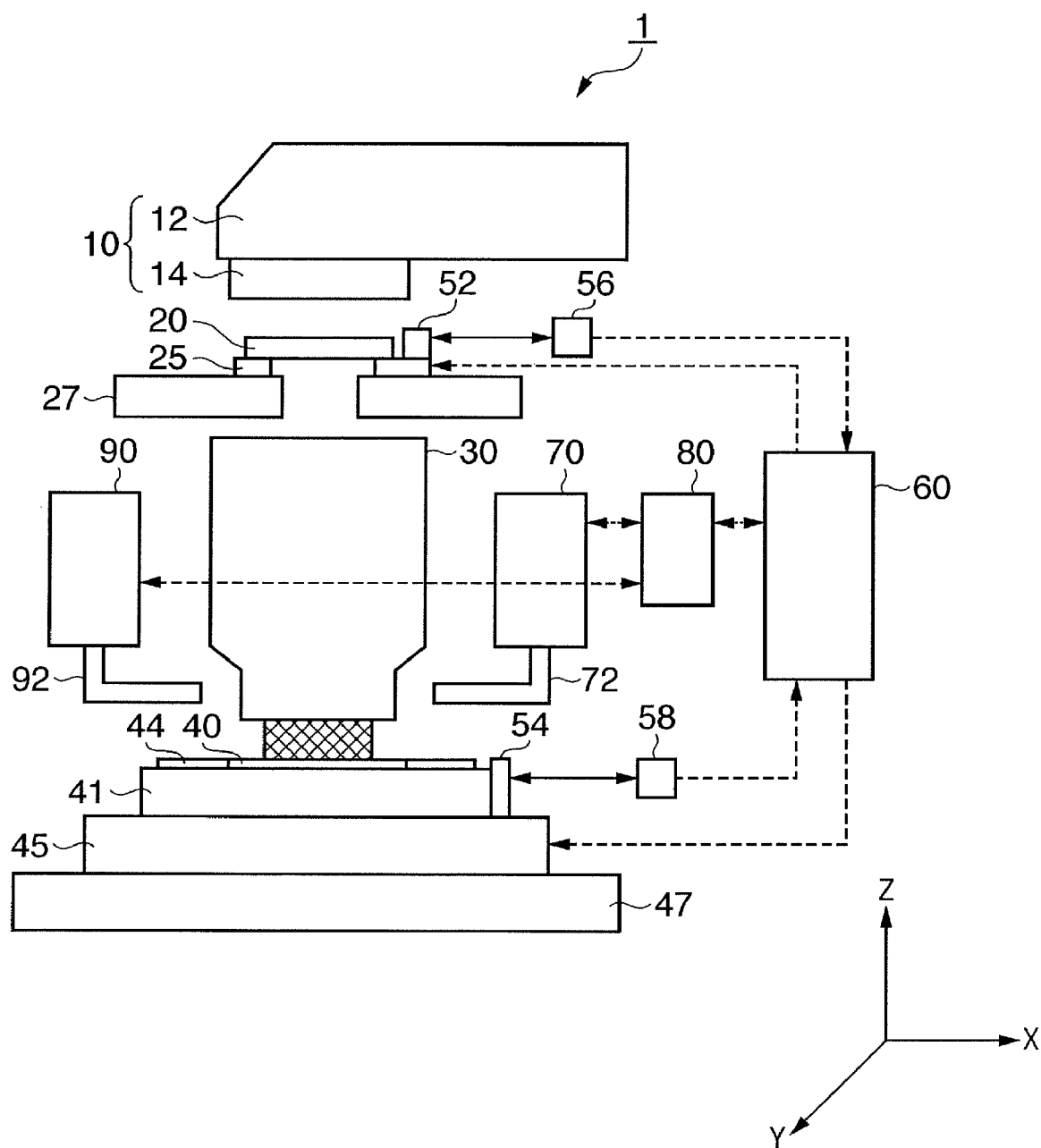
FIG. 1 is a view showing an arrangement of a liquid immersion type exposure apparatus according to an embodiment of the present invention.

The embodiments of the present invention will be described in detail hereafter, with reference to the accompanying drawings. Note that the same members are denoted by the same reference numerals throughout the drawings, and a repetitive explanation will be omitted.

First Embodiment

Arrangement of an Immersion Exposure Apparatus

FIG. 1 is a view showing the arrangement of an immersion type exposure apparatus 1 (to be merely referred to as an "exposure apparatus" as well hereafter), according to the first embodiment of the present invention.

The exposure apparatus 1 can expose a circuit pattern formed on a reticle 20 onto a wafer 40 by a step-and-scan scheme, through a liquid (immersion liquid) LW, supplied between the final surface of a projection optical system 30 on a side of a wafer 40 and the wafer 40. The "step-and-scan scheme" continuously scans the wafer 40 with respect to the reticle 20, to expose the reticle pattern onto the exposure area of the wafer, and steps the wafer to the next exposure area, when one-shot exposure ends, to expose it.

The present invention does not limit the exposure method to the step-and-scan scheme, but can also be applied to a "step-and-repeat scheme" liquid immersion type projection exposure apparatus, which exposes an exposure area one time and, thereafter, exposes the next exposure scan.

The exposure apparatus 1 has an illumination device 10, a reticle stage 25 to place the reticle 20 thereon, the projection optical system 30, and a wafer stage 45, to place the wafer 40 thereon. The exposure apparatus 1 also has a distance measurement device, including measurement mirrors 52 and 54 and laser interferometers 56 and 58, a stage control unit 60, a liquid supply unit 70, an immersion control unit 80, and a liquid recovery unit 90.

The illumination device 10 has a light source unit 12 and an illuminating optical system 14, and illuminates the reticle 20 having a circuit pattern.

The light source unit 12 can use an ArF excimer laser with a wavelength of 193 nm as the light source. The light source unit 12 is not limited to the ArF excimer laser, but may use, e.g., a KrF excimer laser with a wavelength of about 248 nm, or an $F_2$ laser with a wavelength of about 157 nm.

The illumination optical system 14 is an optical system that illuminates the reticle 20, and includes a lens, a mirror, an optical integrator, a stop, a condenser lens, a fly-eye lens, an aperture stop, a condenser lens, a slit, an image-forming optical system, and the like. The optical integrator includes an integrator formed by stacking a fly-eye lens and two sets of cylindrical lens arrays (or lenticular lens) plates, but can be replaced by an optical rod or a diffraction element.

A reticle transport system (not shown) transports the reticle 20 from outside the exposure apparatus 1, and the reticle stage 25 holds and positions the reticle 20 at a predetermined position. The reticle 20 is made of, e.g., quartz, and has a circuit pattern to be transferred. Diffraction light emitted from the illumination optical system 14 passes through the projection optical system 30 and immersion liquid LW via the reticle 20, and is projected onto the wafer 40.

The reticle 20 and wafer 40 are arranged to be optically conjugate to each other. The exposure apparatus 1 can transfer the pattern on the reticle 20 onto the wafer 40 by scanning the reticle 20 and wafer 40 at a speed ratio corresponding to the reduction ratio.

The reticle stage 25 attaches to a surface plate 27, which serves to fix the reticle stage 25. The reticle stage 25 holds the reticle 20 through a reticle chuck (not shown). A moving mechanism (not shown) and the stage control unit 60 controls the movement of the reticle stage 25. The moving mechanism comprises, e.g., a linear motor, and can move the reticle 20 to a predetermined position by driving the reticle stage 25 in the X-direction and Y-direction (a direction perpendicular to the sheet surface of the drawing).

The projection optical system 30 can focus the diffraction light, passing through the pattern formed on the reticle 20, onto the wafer 40. As the projection optical system 30, a dioptric system comprising a plurality of lens elements alone, a catadioptric system comprising a plurality of lens elements, and at least one concave mirror, or the like, can be used.

A wafer transport system (not shown) transports the wafer 40 from outside the exposure apparatus 1, and the wafer stage 45 holds and positions the wafer 40 at a predetermined position. A photoresist is applied to the surface of the wafer 40. Focusing of the diffraction light through the projection optical system 30 exposes the pattern formed on the reticle 20. The application of the present invention is not limited to the wafer 40, but can widely include a liquid crystal substrate, and other substrates coated with a photosensitive material.

A liquid holding plate 44 is an auxiliary member to set the height of the surface of the wafer 40 and that of a peripheral portion around the wafer 40, which holds the wafer 40, to form almost the same surface. Note that the thickness of the liquid holding plate 44 is set to almost match the height of the wafer 40. The liquid holding plate 44 holds the immersion liquid LW locally between the final surface of the projection optical system 30 and the surface of the peripheral portion of the wafer 40, and forms a liquid membrane in an area formed by the peripheral portion of the wafer 40 and the inner portion of the liquid holding plate 44, to enable immersion exposure.

Figure 3:
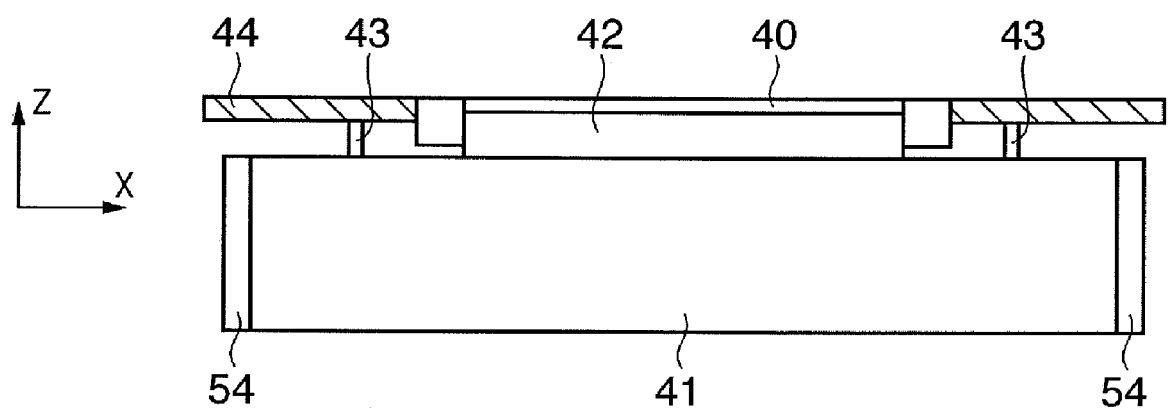
FIG. 3 is a view of the arrangement of the liquid holding plate in FIG. 2, as seen from a side surface (X-Z plane)

The wafer stage 45 attaches to a wafer stage surface plate 47, and can hold the wafer 40 through a wafer stage top plate 41, arranged on the wafer stage 45, and the wafer chuck 42 (FIG. 3). The wafer stage 45 has a function of adjusting the position of the wafer 40 in the vertical direction (Z direction), and the rotational directions and inclinations of the wafer 40 about the X-, Y-, and Z-axes. The stage control unit 60 can control the position, rotation, and inclination of the wafer stage 45. During exposure, the stage control unit 60 controls the wafer stage 45, such that the surface of the wafer 40 always coincides with the focal plane of the projection optical system 30 highly accurately.

The distance measurement device can measure the position of the reticle stage 25 and the two-dimensional position of the wafer stage 45, in real time, through the measurement mirrors 52 and 54 and laser interferometers 56 and 58. The distance measurement result obtained by the distance measurement device is transmitted to the stage control unit 60. The stage control unit 60 drive-controls the reticle stage 25 and wafer stage 45 based on the distance measurement result. The reticle stage 25 and wafer stage 45 are driven at a constant speed ratio under the control of the stage control unit 60, for the purpose of positioning and synchronization control.

The liquid supply unit 70 can supply the liquid LW (see FIG. 4, and the like) between the final surface of the projection optical system 30 and the wafer 40, and has a generator (not shown), which generates the liquid LW, a deaerator (not shown), a temperature controller (not shown), and a liquid supply pipe 72. The liquid supply unit 70 can also include, e.g., a tank which stores the liquid LW, a pressure-feeder, which feeds the liquid LW, and a flow controller, which controls the supply flow rate of the liquid LW.

The liquid supply unit 70 can supply the liquid LW through the liquid supply pipe 72, arranged around the final surface of the projection optical system 30, to form a liquid membrane LW between the projection optical system 30 and wafer 40.

The distance between the final surface of the projection optical system 30 and the wafer 40 is preferably of a degree that allows stable formation and removal of the liquid membrane LW, and is suitably, e.g., 1.0 mm.

The liquid LW is selected from those that absorb less exposure light, and preferably, has a refractive index, which is almost the same as that of a dioptric element, such as quartz or fluorite. More specifically, pure water, functional water, fluoride liquid (e.g., fluorocarbon), or the like, is suitable as the liquid LW.

The generator can decrease impurities, such as metal ions, particles, organic substances, and the like, contained in water supplied from a water supply source (not shown) to generate the liquid LW. The liquid LW, generated by the generator, is supplied to the deaerator. Preferably, the deaerator (not shown) sufficiently removes dissolved gases from the liquid LW in advance. This is because it suppresses generation of bubbles. Even if bubbles are generated, the liquid LW immediately absorbs them. If the deaerator is targeted at nitrogen and oxygen, which are contained in large amounts in air, and removes 80% or more of a gas quantity that can dissolve in the liquid LW, generation of bubbles can be suppressed sufficiently. The exposure apparatus may, of course, be provided with a deaerator (not shown) and supplies the liquid LW to the liquid supply unit 70, while constantly removing gasses dissolving in the liquid LW.

The deaerator can deaerate the liquid LW to decrease oxygen and nitrogen dissolving in the liquid LW, and comprises, e.g., a membrane module and a vacuum pump. As the deaerator, for example, a device is suitable in which the liquid LW is supplied to one side through a gas-permeating membrane and the other side is evacuated, to purge the gases dissolving in the liquid LW into the vacuum through the membrane.

The temperature controller can control the liquid LW to a predetermined temperature. The liquid supply pipe 72 is preferably made of a resin, such as Teflon (registered trademark) resin, a polyethylene resin, or a polypropylene resin that does not contain much elutable substance, so as not to contaminate the liquid LW. When using a liquid other than pure water as the liquid LW, the liquid recovery pipe 72 may be made of a material that is resistant against the liquid LW and does not contain much elutable substance.

The immersion control unit 80 can acquire information on the wafer stage 45, such as the current position, speed, acceleration, target position, moving direction, and the like, from the stage control unit 60, and can control operation concerning immersion exposure based on the acquired information. The immersion control unit 80 sends control commands to the liquid supply unit 70 and liquid recovery unit 90 to control switching between supply and recovery of the liquid LW, stop supply of the liquid LW, flow rate of the liquid LW to be supplied or recovered, and the like.

The liquid holding plate 44 sets the wafer 40 held on the wafer stage 45 and an area around the peripheral portion of the wafer 40 to form almost the same surface to hold the immersion liquid LW on the peripheral portion of the wafer 40. The liquid holding plate 44 also has a recovery function capable of recovering the immersion liquid LW entering the gap between the wafer 40 and liquid holding plate 44. The immersion control unit 80 can also control the operation of the recovery function provided to the liquid holding plate 44 to recover the immersion liquid LW. The liquid holding plate 44 is provided with a circulating flow channel which circulates a temperature adjusting liquid 49, which is temperature-controlled, to control the temperature of the liquid holding plate 44 when the immersion liquid LW is to cool. In order to suppress thermal deformation of the liquid holding plate 44 caused by a temperature decrease caused by cooling of the immersion liquid LW, the immersion control unit 80 controls the temperature of the temperature adjusting liquid 49, based on the measurement result of a temperature measurement unit (not shown), so as to compensate for the decreased temperature. Depending on the amount of cooling of the immersion liquid LW, a sufficient effect can be obtained without using the result of the temperature measurement unit, but by merely circulating the temperature adjusting liquid 49 at a constant temperature.

The liquid recovery unit 90 can recover the liquid LW supplied by the liquid supply unit 70, and can recover the liquid LW through a liquid recovery pipe 92. The liquid recovery unit 90 comprises, e.g., a tank, which reserves the recovered liquid LW temporarily, a suction unit which draws the liquid LW by suction, a flow controller which controls the recovery flow rate of the liquid LW, and the like. The recovery supply pipe 92 is preferably made of a resin, such as Teflon (registered trade mark) resin, a polyethylene resin, or a polypropylene resin that does not contain much elutable substance, so as not to contaminate the liquid LW. When using a liquid other than pure water as the liquid LW, the liquid recovery pipe 92 may be made of a material that is resistant against the liquid LW and does not contain much elutable substance.

(Structure of Liquid Holding Plate)

Figure 2:
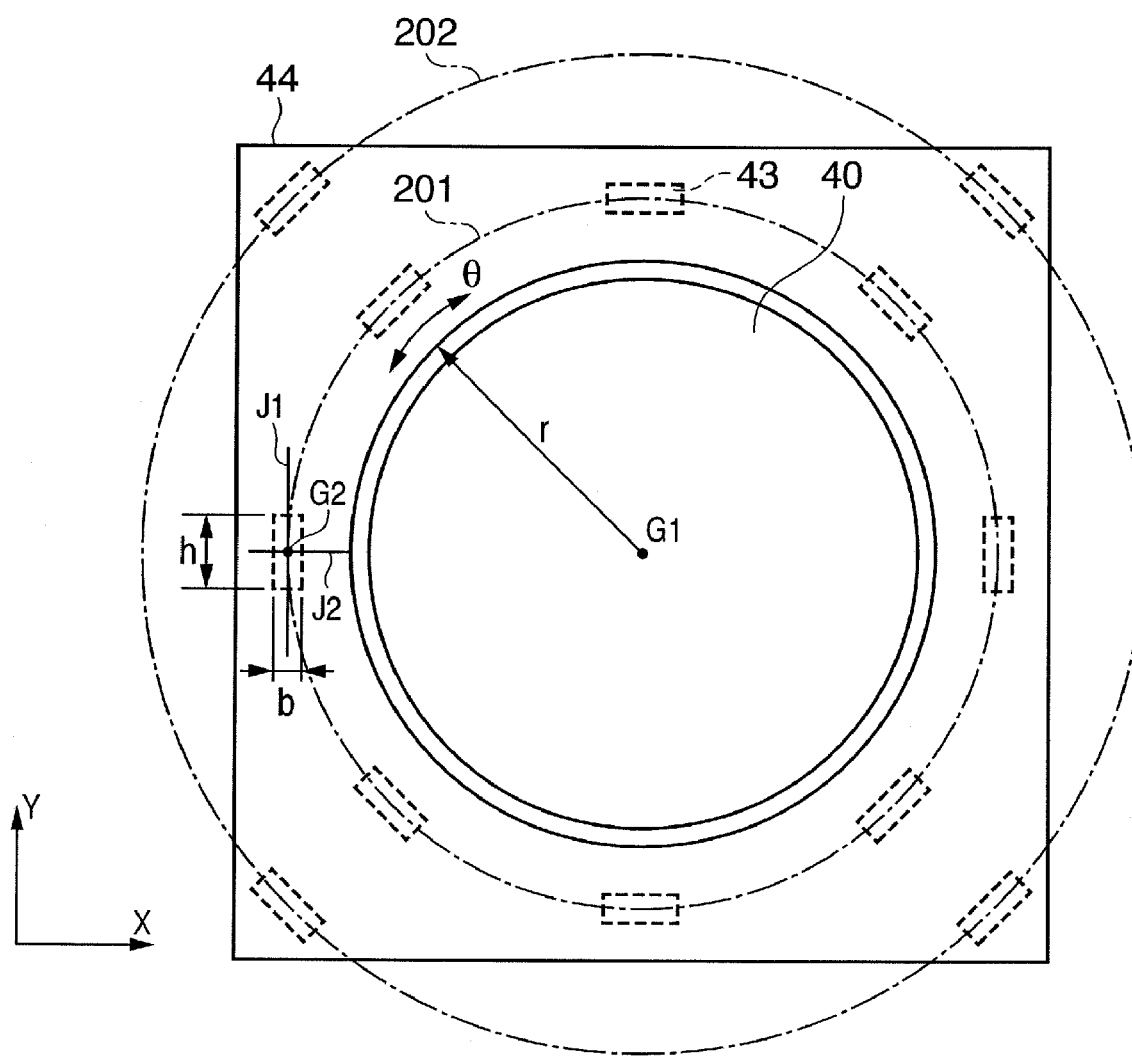
FIG. 2 is a view showing a liquid holding plate according to the first embodiment.

The structure of the liquid holding plate 44 according to an embodiment of the present invention will be described with reference to FIGS. 2 to 4. FIG. 2 is a view showing the arrangement of the wafer 40, the liquid holding plate 44, and attaching members 43, which connect the top plate 41 of the wafer stage 45 to the liquid holding plate 44, within an X-Y plane. FIG. 3 is a view of the arrangement of FIG. 2 seen from a side surface (X-Z plane), and FIG. 4 is an enlarged view of part of FIG. 3.

Figure 4:
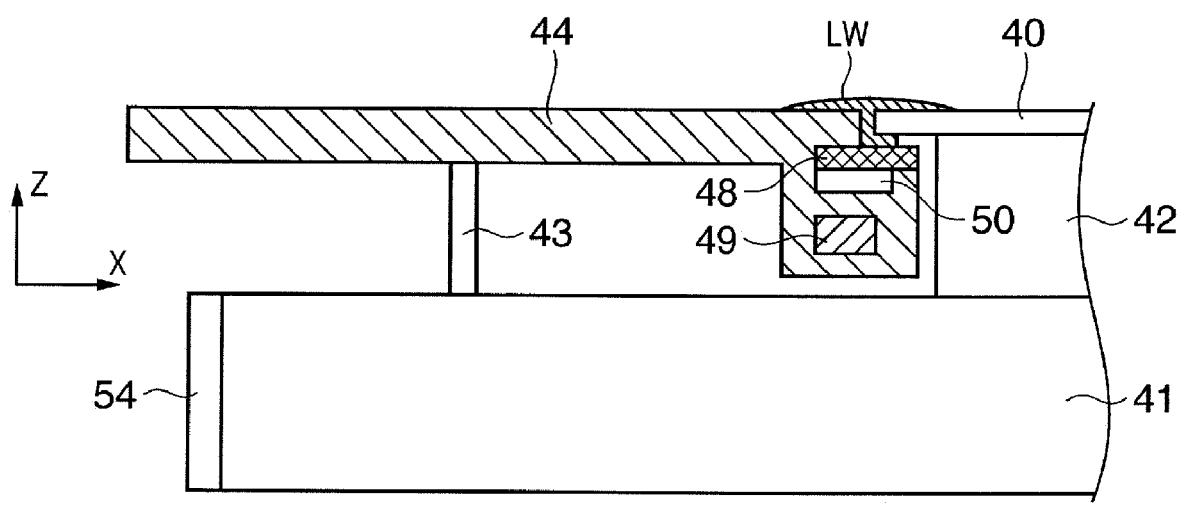
FIG. 4 is an enlarged view of part of FIG. 3.

As shown in FIG. 4, the liquid holding plate 44 comprises a suction member 48 formed of a porous material or having a large number of fine holes to recover the immersion liquid LW entering the gap between the wafer 40 and liquid holding plate 44. A suction device, such as a vacuum pump (not shown), evacuates a suction space 50, formed in the liquid holding plate 44, to communicate with the suction member 48, to a negative pressure, to recover by suction the immersion liquid LW, which is in contact with the surface of the suction member 48.

To suppress any decrease in temperature of the liquid holding plate 44 caused by the vaporization heat (latent heat) of the immersion liquid LW in the suction member 48 and suction space 50, the liquid holding plate 44 is provided with a flow channel to circulate the temperature adjusting liquid 49. The temperature adjusting liquid 49 heats the liquid holding plate 44. Heat from the temperature adjusting liquid 49 can suppress the temperature decrease of the liquid holding plate 44 caused by the vaporization heat (latent heat) of the immersion liquid LW.

Depending on the generated vaporization heat (latent heat), even when the temperature adjusting liquid 49 is supplied to control the temperature of the liquid holding plate 44, a temperature change of, e.g., 0.1° C. level may occur. The occurred temperature change causes the liquid holding plate 44 to thermally deform in accordance with the coefficient of linear thermal expansion of the constituent material. Conventionally, for example, screws rigidly fasten the liquid holding plate 44 to the stage top plate 41 through the attaching members 43. It is confirmed that when the liquid holding plate 44 deforms thermally, a stress caused by the thermal deformation acts on the stage top plate 41 through the attaching members 43, to deform the stage top plate 41 on the level of several nanometers. When the wafer stage top plate 41 deforms, the relative positional relationship between the measurement mirror 54 to measure the position of the wafer stage 45 and the wafer 40 changes undesirably. Degradation in exposure accuracy is thus predicted.

To exclude the adverse effect of the thermal deformation of the liquid holding plate 44, according to this embodiment, the attaching members 43 are formed of elastic members, so the stress of the thermal deformation of the liquid holding plate 44 will not act on the stage top plate 41. As the attaching members 43, for example, elastic rubber members or leaf springs are suitable.

Since the thermal deformation of the liquid holding plate 44 is not easily transferred to the top plate 41, the deformation of the stage top plate 41 caused by the thermal deformation of the liquid holding plate 44 decreases to the order of sub-nanometers or less, and a high exposure accuracy can be maintained. Furthermore, according to this embodiment, since the liquid holding plate 44 is temperature-controlled, the exposure accuracy can be better maintained.

(Rigidity and Arrangement of Attaching Members)

Since the attaching members 43 are formed of elastic members, the liquid holding plate 44 tends to vibrate more easily with respect to the stage top plate 41. This vibration may adversely affect the stage positioning accuracy and, finally, the exposure accuracy. According to this embodiment, the elastic deformation of the attaching members 43 absorbs the thermal deformation of the liquid holding plate 44. To suppress the vibration with respect to the stage top plate 41, the sectional shapes of the attaching members 43 are determined, such that the rigidities of the attaching members 43 decrease in the direction in which thermal deformation occurs easily and increase in the remaining directions. The attaching members 43, having such sectional shapes, are arranged on the wafer stage top plate 41.

The liquid holding plate 44 deforms to shrink toward the center of the wafer 40, mainly when the temperature around the wafer 40 changes. Accordingly, the deformation amount in the radial direction (r) becomes larger than that in the circumferential direction (θ). According to this embodiment, the sectional shapes of the attaching members 43 are determined such that the rigidities of the attaching members 43 decrease in the radial direction in which thermal deformation occurs easily and increase in the circumferential direction. The attaching members 43 having such sectional shapes are arranged on the wafer stage top plate 41.

More specifically, as shown in FIG. 2, the attaching members 43 are arranged on almost concentric circumferences 201 and 202, each having a center at a wafer center G1. The sectional shape of each attaching member 43 is set such that its length (h) in the circumferential direction is larger than its thickness (b) in the radial direction.

Note that each attaching member 43 is preferably arranged such that its center of gravity G2 is arranged on the circumference 201 or 202, that its major axis J1 in the circumferential direction is almost in contact with the circumference 201 or 202, and that its major axis J2 in the radial direction is almost perpendicular to the circumference 201 or 202.

In general, the rigidity of the attaching member 43 can be obtained from E·I, where E is the elastic modulus of the attaching member 43 and I is the secondary moment in the deforming direction of the section. The rigidities in the radial and circumferential directions can be obtained from equations (1) and (2):

$$\text{Radial rigidity } EIr = E \cdot (h \cdot b^3 / 12) \tag{1}$$

$$\text{Circumferential rigidity } EI\theta = E \cdot (b \cdot h^3 / 12) \tag{2}$$

Equations (1) and (2) will be compared. From the relation of h>b, the rigidity in the radial direction is lower than that in the circumferential direction. When the same stress acts on the attaching member 43, the attaching member 43 tends to deform more easily in the radial direction than in the circumferential direction.

As shown in FIG. 2, by arranging the attaching members 43 on the circumferences 201 and 202, which are almost concentric with respect to the center G1 of the wafer 40, the attaching members 43 can suppress vibration with respect to the stage top plate 41, while absorbing thermal deformation of the liquid holding plate 44.

In order to impart the rigidities of the attaching members with anisotropy (such that the rigidity decreases in the direction in which thermal deformation easily occurs and increases in the remaining directions), each attaching member 43 may be formed of a plurality of members having different attributes.

The characteristic features of the liquid holding plate 44 have been exemplified above mainly by a temperature decrease near the suction member 48. Depending on how the immersion liquid LW remains, a temperature decrease due to vaporization can also occur on the surface of the liquid holding plate 44, other than near the suction member 48. In this case, the same effect can be expected by matching the direction of thermal deformation of the liquid holding plate 44 and the low-rigidity directions of the attaching members 43 to each other.

This embodiment can provide an exposure apparatus, which suppresses the influence of the thermal deformation of the liquid holding plate caused by vaporization heat of the immersion liquid and realizes excellent exposure accuracy.

Second Embodiment

The second embodiment of the present invention will be described with reference to FIGS. 5 and 6. The same portions as those in the arrangement according to the first embodiment are denoted by the same reference numerals, and a repetitive description of the common arrangement is omitted.

Figure 5:
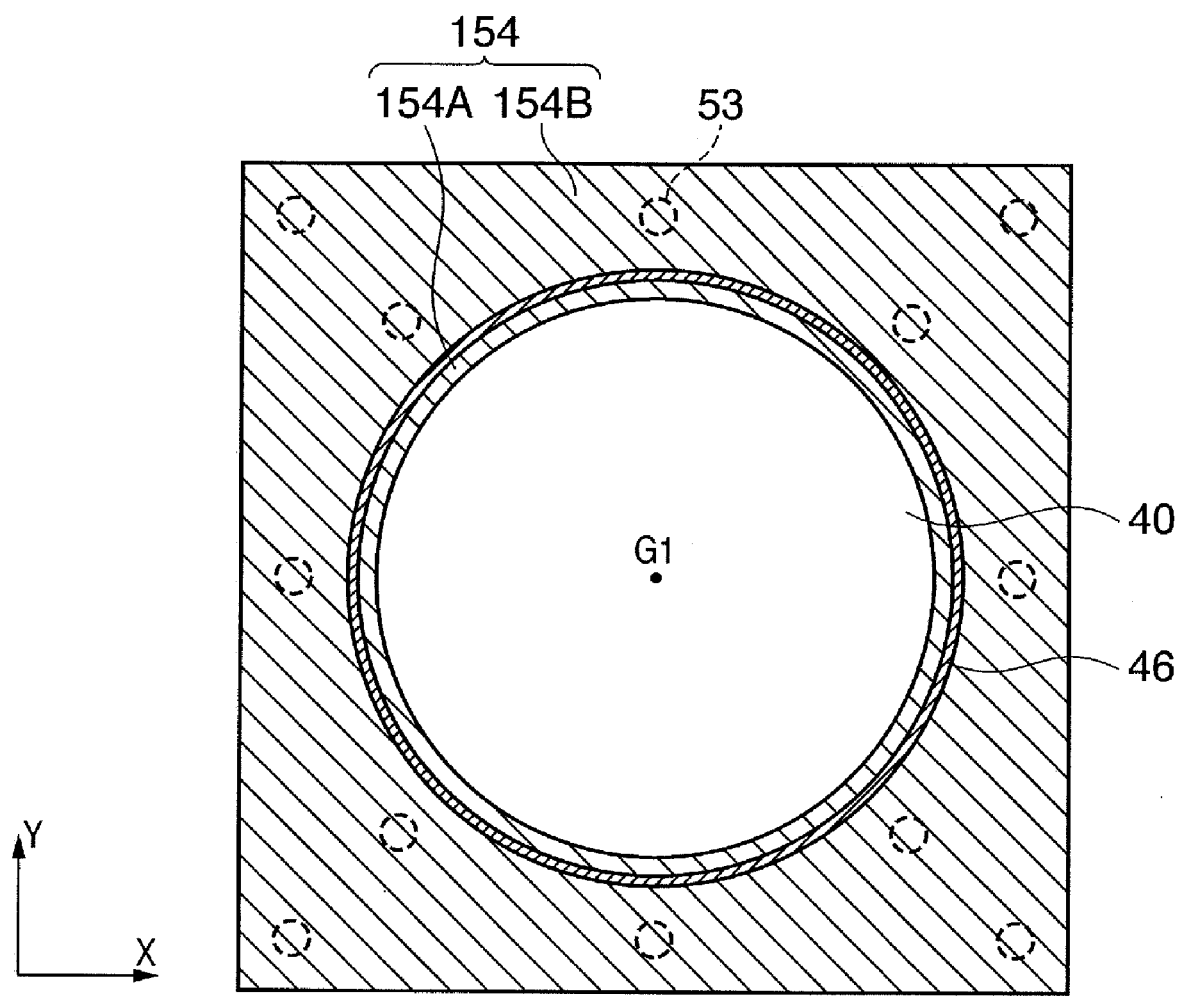
FIG. 5 is a view showing a liquid holding plate according to the second embodiment.
Figure 6:
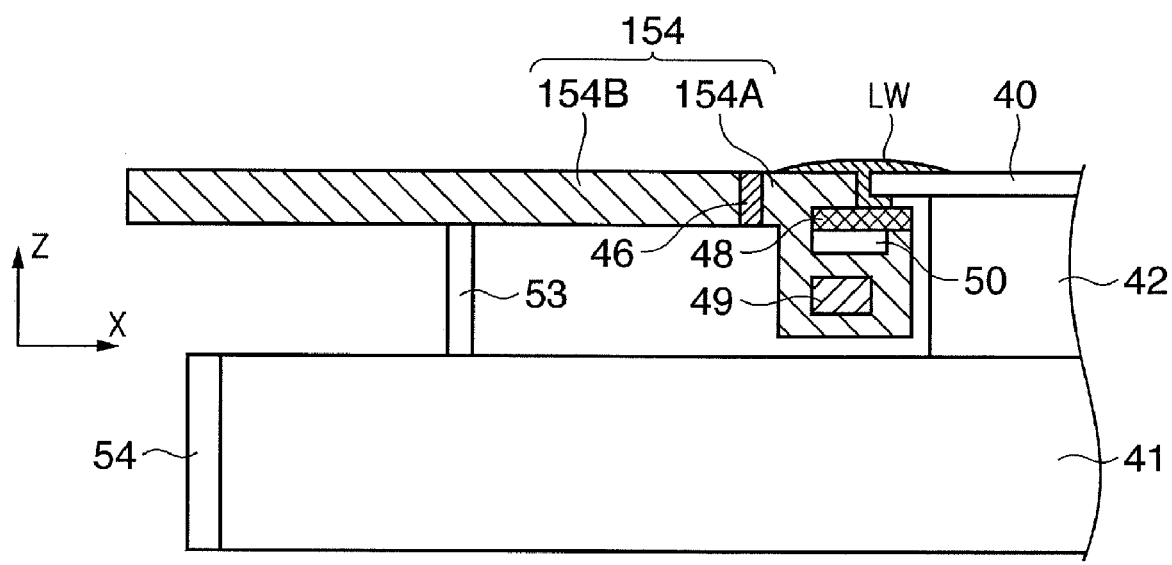
FIG. 6 is an enlarged view of the arrangement of the liquid holding plate in FIG. 5, as seen form a side surface (X-Z plane)

FIG. 5 is a view showing the arrangement of a wafer 40, a liquid holding plate 154, and attaching members 53, which connect a top plate 41 of a wafer stage 45 to the liquid holding plate 154, in the X-Y plane. The liquid holding plate 154 according to this embodiment is different from the liquid holding plate 44 according to the first embodiment in that it comprises a plurality of members (a member 154A and a member 154B). The arrangement of liquid holding plate 154 will be described later in detail. FIG. 6 is an enlarged view of part of the arrangement in FIG. 5 seen from a side surface (X-Z plane).

The liquid holding plate 154, according to this embodiment, is divided into a wafer peripheral area (to be referred to as the "liquid holding plate inner member 154A" hereafter), which is susceptible to the vaporization heat of an immersion liquid LW, and an area (to be referred to as the "liquid holding plate outer member 154B" hereafter), which is relatively not susceptible to the vaporization heat. A connection member 46 connects the divisional liquid holding plate inner member 154A and liquid holding plate outer member 154B to constitute the liquid holding plate 154.

The connection member 46 is preferably an elastic member, which has a relatively lower rigidity than that of the liquid holding plate 154. By employing the elastic member, the connection member 46 can absorb the thermal deformation occurring in the liquid holding plate inner member 154A that the immersion liquid LW cools, by elastic deformation, to decrease the thermal deformation to be transferred to the liquid holding plate outer member 154B.

For example, the connection member 46 can be formed of a leaf spring with a rigidity, which is low only in the radial direction with respect to a center G1 of the wafer 40. By holding the liquid holding plate inner member 154A, which is susceptible to a temperature change caused by the vaporization heat, i.e., which has the largest thermal deformation, by the connection member 46, most of the thermal deformation occurring in the liquid holding plate inner member 154A can be absorbed by the connection member 46. In other words, absorption of the thermal deformation of the liquid holding plate inner member 154A by the connection member 46 prevents the thermal deformation from adversely affecting the liquid holding plate outer member 154B.

Furthermore, if a resin, such as an adhesive material, is adopted as the connection member 46, a heat insulating effect between the members (the liquid holding plate inner member 154A and liquid holding plate outer member 154B) can also be expected.

In this arrangement, the liquid holding plate inner member 154A may deform on the micrometer level. This amount of deformation does not adversely affect the exposure accuracy. Even if the liquid holding plate inner member 154A deforms, the connection member 46 absorbs its deformation amount. Thus, stress caused by the thermal deformation does not act on the liquid holding plate outer member 154B, so the deformation amount of the entire liquid holding plate 154 can be suppressed to the nanometer level. Even if the attaching members 53 rigidly fasten the liquid holding plate outer member 154B to the stage top plate 41, the thermal deformation is not adversely transferred to the stage top plate 41, and the deformation amount of the wafer stage top plate 41 can be suppressed to the sub-nanometer level or less.

This embodiment can provide an exposure apparatus which suppresses the influence of the thermal deformation of the liquid holding plate caused by vaporization heat of the immersion liquid and realizes excellent exposure accuracy.

Third Embodiment

The third embodiment of the present invention will be described with reference to FIGS. 7 and 8. The same portions as those in the arrangements according to the first and second embodiments are denoted by the same reference numerals, and a repetitive description of the common arrangement is omitted.

Figure 7:
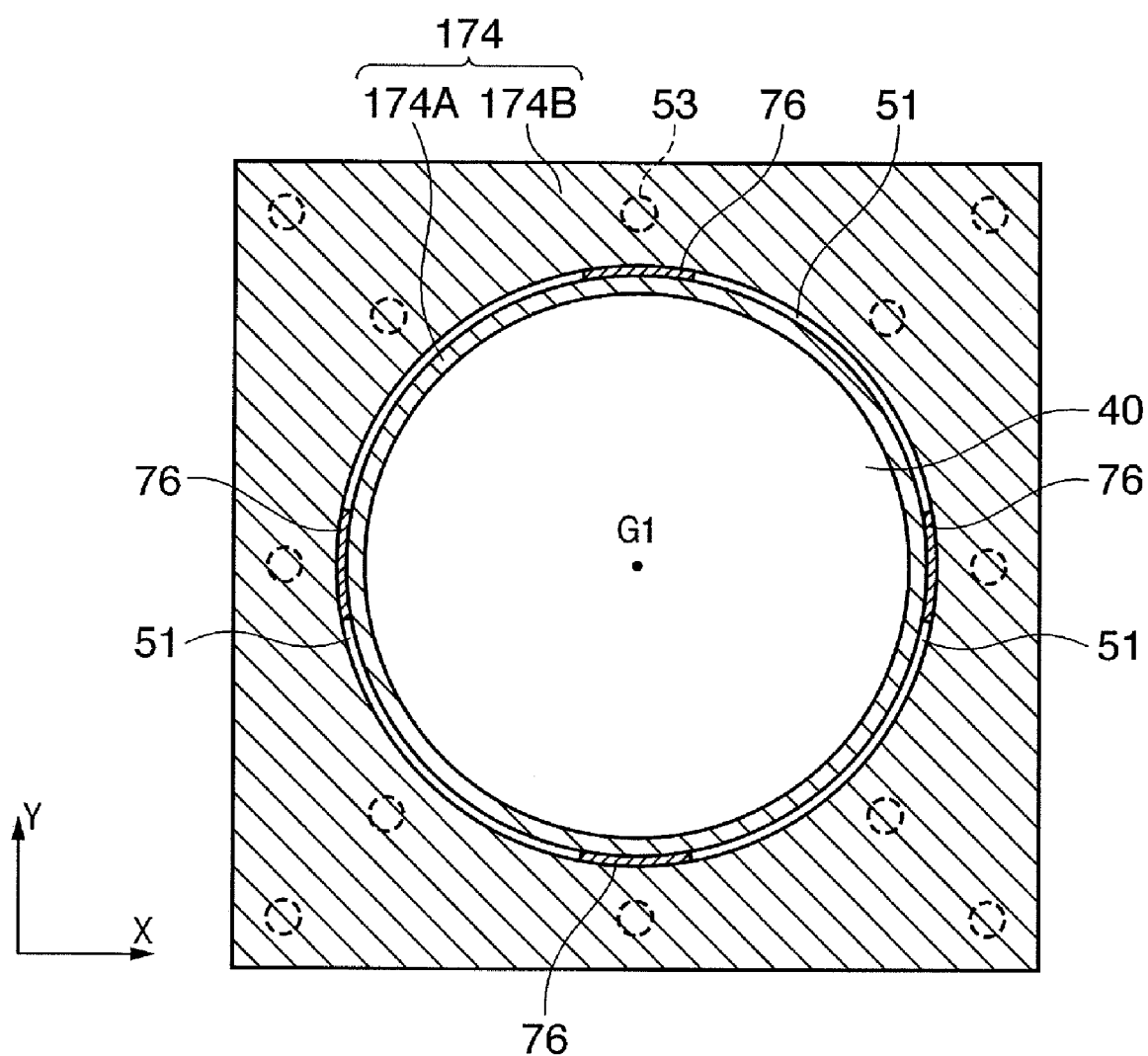
FIG. 7 is a view showing a same structure member according to the third embodiment.
Figure 8:
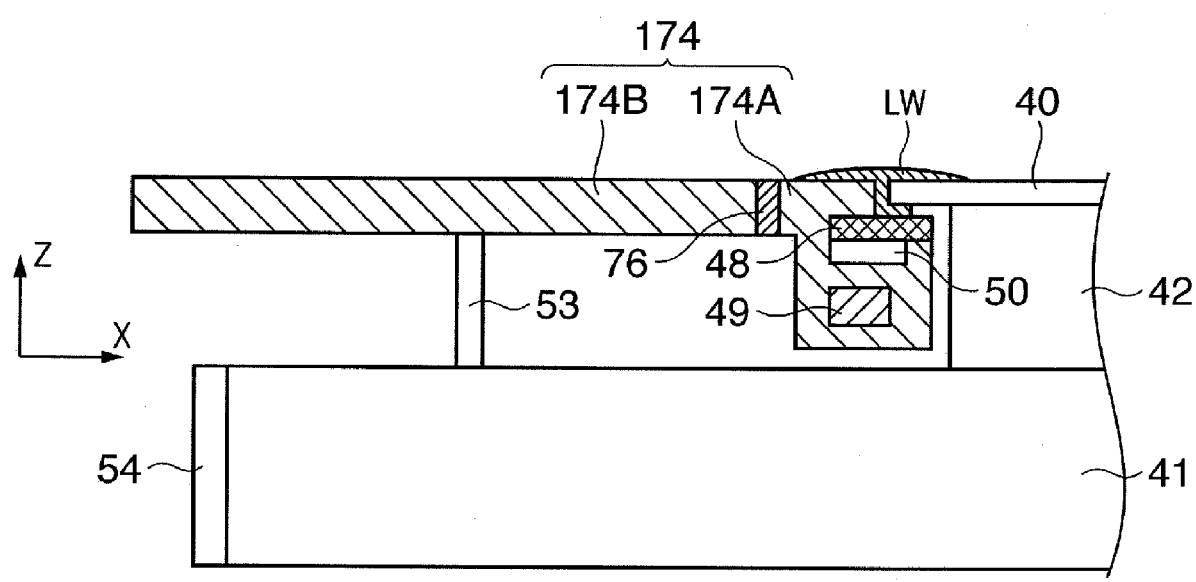
FIG. 8 is an enlarged view of the arrangement of the liquid holding plate in FIG. 7, as seen from a side surface (X-Z plane)

FIG. 7 is a view showing the arrangement of a wafer 40, a liquid holding plate 174, and attaching members 53, which connect a top plate 41 of a wafer stage 45 to the liquid holding plate 174, in the X-Y plane. The liquid holding plate 174 according to this embodiment is different from the liquid holding plate 154 according to the second embodiment, in that a separating portion 51 is provided between a plurality of members (a member 174A and a member 174B). The arrangement of liquid holding plate 174 will be described later in detail. FIG. 8 is an enlarged view of part of the arrangement in FIG. 7 seen from a side surface (X-Z plane).

The liquid holding plate 174, according to this embodiment, is divided into a wafer peripheral area (to be referred to as the "liquid holding plate inner member 174A" hereafter), which is susceptible to the vaporization heat of an immersion liquid LW, and an area (to be referred to as the "liquid holding plate outer member 174B" hereafter), which is relatively not susceptible to the vaporization heat. Connection members 76 connect the divisional liquid holding plate inner member 174A and liquid holding plate outer member 174B to constitute the liquid holding plate 174.

The presence of the separating portion 51 between the liquid holding plate inner member 174A and liquid holding plate outer member 174B enables the separating portion 51 to release the thermal deformation occurring in the liquid holding plate inner member 174A. Release of the large thermal deformation by the separating portion 51 can decrease the influence of the thermal deformation acting on the connection members 76. The thermal deformation of the connection members 76 becomes smaller than that acting on the connection member 46 in the second embodiment. Thus, as the connection members 76, other than elastic members, a member that connects the liquid holding plate inner member 174A to the liquid holding plate outer member 174B in a rigid state can also be employed. Furthermore, what matters most in this embodiment is to provide the separating portion 51. Therefore, the liquid holding plate inner member 174A, liquid holding plate outer member 174B, and the connection members 76 need not be formed of separate members, but may be formed integrally by, for example, boring one plate to form a separating portion 51.

According to this embodiment, the four connection members 76 connect the liquid holding plate inner member 174A to the liquid holding plate outer member 174B. However, the present invention is not limited to this arrangement. More specifically, the sizes and number of the connection members 76 are preferably determined considering influences, such as the thermal deformation occurring in the liquid holding plate inner member 174A and the acceleration of the wafer stage 45.

In other words, it is preferable to determine the sizes (sectional shapes, or the like) and number that realize the rigidity that the connection members 76 should have, considering the direction (X and Y directions in FIG. 5) of acceleration mainly generated by the exposure operation, so that the connection members 76 can support a force generated by the acceleration of the wafer stage 45.

By providing the separating portion 51, which is a gap, between the liquid holding plate inner member 174A, which is susceptible to the vaporization heat, and the liquid holding plate outer member 174B, a heat insulating effect can be expected between the same surface inner member 174A and liquid holding plate outer member 174B. Thus, even when the vaporization heat adversely affects the liquid holding plate inner member 174A to decrease its temperature, the heat insulating effect of the separating portion 51 can suppress transfer of a temperature change (can insulate heat) of the liquid holding plate inner member 174A to the liquid holding plate outer member 174B. More specifically, an exposure apparatus with excellent exposure accuracy can be provided, in which the temperature decrease of the liquid holding plate inner member 174A and the thermal deformation due to the temperature decrease are prevented from adversely affecting the liquid holding plate outer member 174B, and, accordingly, which is not adversely affected by the thermal deformation caused by vaporization heat.

In the second and third embodiments, the attaching members 53 fasten the liquid holding plates 154 and 174 to the stage top plate 41. Alternatively, the attaching members 43 described in the first embodiment may be combined with the liquid holding plate 154 or 174 according to the second or third embodiment.

This embodiment can provide an exposure apparatus which suppresses the influence of the thermal deformation of the liquid holding plate caused by vaporization heat of the immersion liquid and realizes excellent exposure accuracy.

Fourth Embodiment

Figure 9:
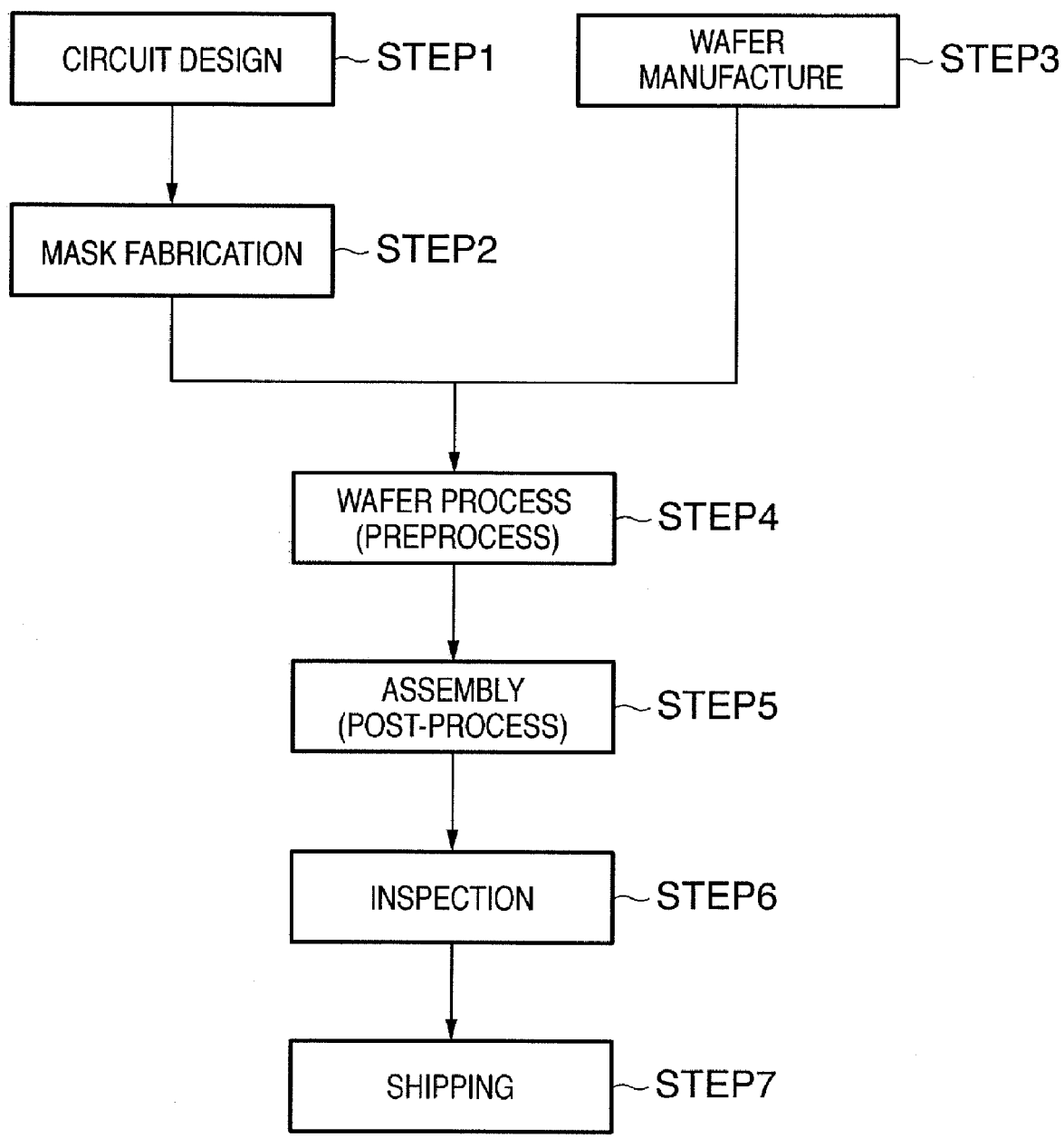
FIG. 9 is a flowchart to explain the manufacture of devices according to the fourth embodiment.

An embodiment of a device manufacturing method, which uses the exposure apparatus 1 according to the above embodiments, will be described with reference to FIGS. 9 and 10. FIG. 9 is a flowchart to explain the manufacture of devices (e.g., a semiconductor device, a liquid crystal device, and the like). The manufacture of the semiconductor device will be described as an example. In step 1 (circuit design), the circuit of a semiconductor device is designed. In step 2 (mask fabrication), a mask having the designed circuit pattern is fabricated. In step 3 (wafer manufacture), a wafer is manufactured using a material such as silicon. Step 4 (wafer process) is called a preprocess, in which an actual circuit is formed on the wafer by lithography according to the present invention using the mask and wafer. Step 5 (assembly) is called a post-process, in which a step of forming a semiconductor chip is performed by using the wafer formed in step 4, and which includes processes such as assembly (dicing and bonding) and packaging (chip encapsulation). In step 6 (inspection), inspections, including an operation check test and a durability test, of the semiconductor device formed in step 5 are performed. A semiconductor device is finished with these processes and shipped (step 7).

Figure 10:
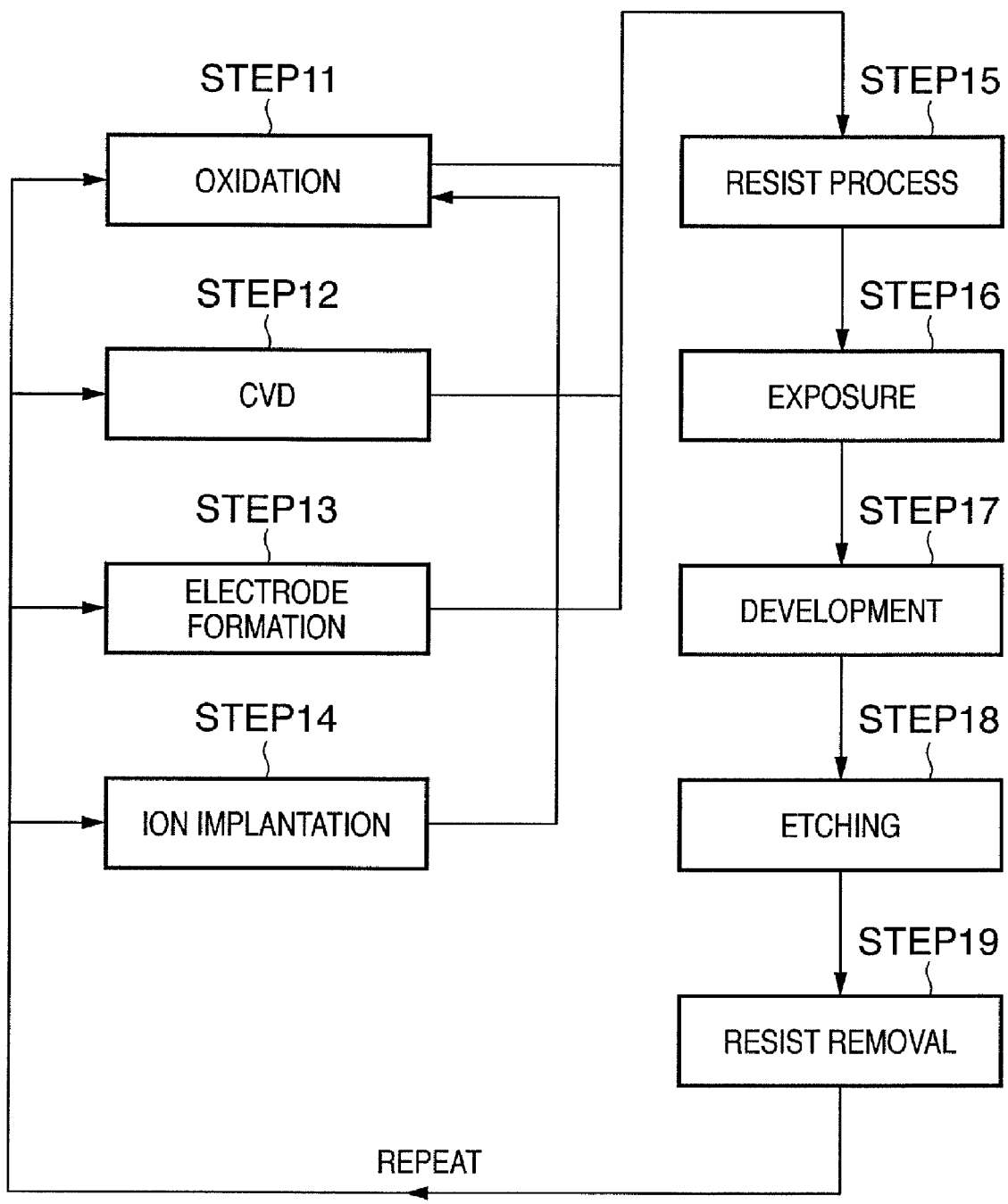
FIG. 10 is a flowchart to explain in detail the wafer process of step 4 shown in FIG. 4.

FIG. 10 is a flowchart to explain in detail the wafer process of step 4. In step 11 (oxidation), the surface of the wafer is oxidized. In step 12 (CVD), an insulating film is formed on the wafer surface. In step 13 (electrode formation), an electrode is formed on the wafer by deposition, or the like. In step 14 (ion implantation), ions are implanted into the wafer. In step 15 (resist process), a photosensitive material is applied to the wafer. In step 16 (exposure), the exposure apparatus 1 exposes the mask pattern onto the wafer. In step 17 (development), the exposed wafer is developed. In step 18 (etching), portions other than the developed resist image are etched. In step 19 (resist removal), any unnecessary resist after etching is removed. By repeating these steps, multilayered circuit patterns are formed on the wafer. This device manufacturing method can manufacture a device having a quality higher than that of a conventional device. In this manner, the device manufacturing method which employs the exposure apparatus 1, and a device, as a resultant object, also constitute aspects of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus which exposes a pattern of an original onto a substrate, while a liquid fills a gap between a projection optical system and the substrate, said apparatus comprising:
   a liquid holding plate which sets the substrate held on a substrate stage and a peripheral area around a peripheral portion of the substrate to form substantially the same surface, to hold the liquid on the peripheral portion of the substrate, wherein said liquid holding plate includes:
   (i) an inner member formed in the peripheral area around the peripheral portion of the substrate and holds the liquid on the peripheral portion of the substrate;
   (ii) an outer member formed on a peripheral portion of said inner member and attaching to the substrate stage; and
   (iii) a connection member which connects said inner member to said outer member, wherein said connection member is a member having a lower rigidity than those of said inner member and said outer member.

2. The apparatus according to claim 1, further comprising a temperature controller to control a temperature of said liquid holding plate, which is cooled by the liquid.

3. The apparatus according to claim 1, wherein said liquid holding plate includes a recovery mechanism capable of recovering the held liquid.

4. The apparatus according to claim 1, wherein said connecting member absorbs deformation, occurring in said inner member cooled by the liquid, by elastic deformation, to decrease a deforming force which is to act on said outer member.

5. The apparatus according to claim 1, further comprising a separating portion which forms a gap between said inner member and said outer member, wherein said separating portion insulates a temperature change, occurring in said inner member, which is cooled by the liquid, with respect to said outer member.

6. The apparatus according to claim 1, wherein said inner member, said outer member, and said connection member are formed integrally.

7. The apparatus according to claim 1, further comprising an attaching member to attach said liquid holding plate onto said substrate stage, wherein said attaching member absorbs deformation occurring in said liquid holding plate by elastic deformation, to decrease deformation which is to act on said substrate stage.

8. A device manufacturing method comprising:
a step of exposing a substrate using an exposure apparatus according to claim 1; and
a step of developing the exposed substrate.

9. The apparatus according to claim 1, wherein said connection member includes a leaf spring having a rigidity that is low only in a radial direction with respect to a center of the substrate.

10. The apparatus according to claim 1, wherein said connection member includes a resin.

* * * * *